United States Patent
Morikawa et al.

(10) Patent No.: US 8,153,926 B2
(45) Date of Patent: Apr. 10, 2012

(54) ETCHING METHOD AND SYSTEM

(75) Inventors: Yasuhiro Morikawa, Susono (JP);
Toshio Hayashi, Susono (JP); Koukou Suu, Susono (JP)

(73) Assignee: ULVAC, Inc., Chigasaki (JP)

( * ) Notice: Subject to any disclaimer, the term of this patent is extended or adjusted under 35 U.S.C. 154(b) by 5 days.

(21) Appl. No.: 12/750,877

(22) Filed: Mar. 31, 2010

(65) Prior Publication Data

US 2010/0203737 A1   Aug. 12, 2010

Related U.S. Application Data

(62) Division of application No. 11/571,600, filed as application No. PCT/JP2005/012019 on Jun. 23, 2005, now Pat. No. 7,728,252.

(30) Foreign Application Priority Data

Jul. 2, 2004 (JP) .................................. 2004-196593

(51) Int. Cl.
*B23K 10/00* (2006.01)

(52) U.S. Cl. ......... 219/121.43; 219/121.41; 219/121.58; 118/723 I; 156/345.47

(58) Field of Classification Search ............... 219/121.4, 219/121.41, 121.43, 121.44; 118/723 R, 118/723 I; 156/345.38, 345.47, 345.48; 315/111.21, 315/111.51

See application file for complete search history.

(56) References Cited

U.S. PATENT DOCUMENTS

| 4,795,299 A * | 1/1989 | Boys et al. ............... 414/217 |
| 6,287,986 B1 * | 9/2001 | Mihara ..................... 438/763 |
| 6,758,948 B2 * | 7/2004 | Johnson ................. 204/192.12 |
| 2003/0026917 A1 * | 2/2003 | Lin et al. .................. 427/453 |
| 2004/0219737 A1 * | 11/2004 | Quon ........................ 438/222 |

* cited by examiner

*Primary Examiner* — Mark Paschall
(74) *Attorney, Agent, or Firm* — Stites & Harbison PLLC; Jeffrey A. Haeberlin

(57) ABSTRACT

An etching method and an etching system are adapted to produce a high etch selectivity for a mask, an excellent anisotropic profile and a large etching depth. An etching system according to the invention comprises a floating electrode arranged vis-à-vis a substrate electrode in a vacuum chamber and held in a floating state in terms of electric potential, a material arranged at the side of the floating electrode facing the substrate electrode to form an anti-etching film and a control unit for intermittently applying high frequency power to the floating electrode. An etching method according to the invention uses a material arranged at the side of the floating electrode opposite to the substrate electrode to form an anti-etching film as target and only rare gas as main gas and is adapted to repeat a step of forming a film on the substrate by sputtering by applying high frequency power to the floating electrode and a step of subsequently etching the substrate by suspending the application of high frequency power to the floating electrode and introducing etching gas into the vacuum chamber in a predetermined sequence.

11 Claims, 7 Drawing Sheets

ETCHING METHOD AND SYSTEM

TECHNICAL FIELD

The present invention relates to an etching method and an etching system that can find applications in the field of forming micro electromechanical systems and manufacturing micro electronic apparatus.

BACKGROUND ART

Fluorine atoms (radicals) reacts spontaneously with silicon at room temperature so that it is not possible to produce an anisotropic etching profile in a silicon substrate unless the substrate is cooled to −140° C. when forming a deep hole in the substrate in a vertical direction with a lateral wall standing perpendicularly relative to the substrate, suppressing the hole from extending transversally. Therefore, when etching silicon, using fluorine gas, it is necessary to suppress isotropic etching by forming an anti-etching or protecting film on the lateral wall for the purpose of producing a desired anisotropic etching profile in the silicon.

Anisotropic etching methods of forming an anti-etching film on the lateral wall to produce an anisotropic etching profile in silicon are known (see Patent Documents 1 and 2).

With the anisotropic etching method described in Patent Document 1, polymerization steps and etching steps are conducted alternately and continuously to form a polymer layer in each polymerization step on the surface exposed by the immediately preceding etching step to protect the lateral surface against etching in the succeeding etching step.

With the anisotropic etching method described in Patent Document 2, there are alternately and repeatedly conducted a step of conducting anisotropic etching by introducing mixture gas containing etching gas ($SF_6$) and passivation gas ($CHF_3$, $C_4F_n$, etc.) into a process chamber, exciting it by means of electromagnetic radiation and, at the same time, applying a high bias voltage to the substrate, and a step of producing unsaturated monomers in plasma by exciting the mixture gas by means of electromagnetic radiation and, at the same time, forming a protective polymer coat on the lateral wall having an exposed surface to be subjected to etching by applying a low bias voltage to the substrate.

Patent Document 1: U.S. Pat. No. 5,501,893
Patent Document 2: Jpn. Pat. Appln. Laid-Open Publication No. 2000-323454

However, with the prior art method described in Patent Document 1, the temporal ratio of each etching step and the immediately succeeding polymerization step depends on the velocity of the gas mixture being introduced and changes from time to time to adversely affect the uniformity of etching because different gas mixtures are repeatedly used in the etching steps and the polymerization steps. Additionally, a complex apparatus is required to realize the method because solenoid valves have to be used to switch from one of the two gas mixtures to the other and vice versa. Still additionally, a problem of generation of particles arises due to the gas mixture introduced in the polymerization steps.

With the prior art method described in Patent Document 2, it is necessary to shift the bias voltage being applied to the substrate from the level good for the etching step to the level good for the polymerization step and vice versa and hence requires a control system having a complex configuration to consequently raise the cost of the apparatus for realizing the method. Additionally, a problem of generation of particles arises due to the gas mixture introduced in the polymerization steps. Still additionally, a high energy RF power has to be applied for forming a polymer film to raise the energy cost.

Furthermore, with the method of forming an anti-etching film, using passivation gas, only several % to a little more than 10% of the introduced passivation gas takes part in the film forming activity. The passivation gas that does not take part in the film forming activity is exhausted from the vacuum chamber. Since passivation gas shows a high atmosphere warming coefficient and constitutes a negative factor for environment protection, the exhausted passivation gas needs to be collected and processed. The operation of processing passivation gas involves large cost and hence it is not desirable to use passivation gas.

A high bias etching method that uses HBr is also known for obtaining an anisotropic etching profile. However, it is not possible to etch silicon deep with this method because of the problems it entails including that a high etch selectivity cannot be expected for a mask and it is not suited for forming micro electromechanical systems and manufacturing micro electronic apparatus, although it can suitably be used for more microscopic patterns.

DISCLOSURE OF THE INVENTION

In view of the above-identified problems of the prior art, it is therefore the object of the present invention to provide an etching method and an etching system adapted to produce a high etch selectivity for a mask, an excellent anisotropic profile and a large etching depth.

In the first aspect of the present invention, there is provided an etching system comprising a plasma generating means for generating plasma in a vacuum chamber, a substrate electrode arranged in the vacuum chamber and a high frequency (RF) bias power source applying high frequency bias power to the substrate electrode and etching a substrate mounted on the substrate electrode, characterized by also comprising:

a floating electrode arranged vis-à-vis the substrate electrode, a high frequency power source for applying high frequency power to the floating electrode, a solid material arranged at the side of the floating electrode facing the substrate electrode so as to be sputtered to form an anti-etching film on the substrate, and a control unit for controlling the high frequency power applied to the floating electrode to intermittently sputter the solid material.

In the etching system according to the present invention, further, an etching gas introducing means for introducing etching gas is provided and the control unit may be intended to control the application of the high frequency power to the floating electrode, the application of the high frequency bias power to the substrate electrode and the introduction of etching gas into the vacuum chamber in a predetermined sequence.

The control unit may be intended to operate so as to introduce etching gas into the vacuum chamber when the solid material is not sputtered.

The control unit may be intended to operate to introduce etching gas into the vacuum chamber when the solid material is not sputtered or when high frequency bias power is not applied to the substrate electrode.

The control unit may be intended to operate so as to apply high frequency bias power to the substrate electrode after the solid material is sputtered.

In one embodiment of the etching system according to the present invention, the high frequency power source is connected to the floating electrode by way of a switch or a variable condenser and also to the plasma generating means so as to be also used to generate plasma, and the control unit may be intended to control the switch or the variable condenser, whichever appropriate, so as to apply high frequency power to the floating electrode when sputtering the solid material.

The control unit may be intended to control the high frequency power source so as to differentiate the output of the power source at the time of sputtering the solid material and at the time of etching the substrate.

The solid material for forming the anti-etching film may be selected from fluorine resin, silicon, carbon, silicon carbide, silicon oxide and silicon nitride. The solid material may be silicon and etching gas and oxide may be introduced continuously.

The substrate may be a silicon substrate. In stead, the substrate may be a quartz substrate.

According to the second aspect of the present invention, an etching method for etching a substrate arranged in a vacuum chamber by generating plasma is characterized by repetitively conducting, a substrate etching step of etching the substrate by introducing etching gas into the vacuum chamber, an anti-etching film forming step of forming an anti-etching film on the substrate by sputtering a solid material arranged vis-a-vis the substrate, and an anti-etching film removing step of applying high frequency bias power to the substrate electrode where the substrate is arranged and etching part of the anti-etching film.

Rare gas may be used as sputtering gas in the anti-etching film forming step.

A mixture of rare gas and etching gas may be used in the substrate etching step.

Rare gas or a mixture of rare gas and etching gas may be used in the anti-etching film removing step.

A predetermined rare gas may be introduced into the vacuum chamber in each of the substrate etching step, the anti-etching film forming step and the anti-etching film removing step and etching gas may be added to rare gas to form a mixture gas to be used in the substrate etching step or the substrate etching step and the anti-etching film removing step.

Rare gas may be selected from Ar, Xe, Kr and $N_2$.

Etching gas may be selected from $SF_6$, $NF_3$, $F_2$, $SiF_4$ and $XeF_2$.

In the etching method according to the present invention, the substrate etching step may be conducted without applying high frequency bias power to the substrate electrode.

In the etching method according to the present invention, the solid material may be selected from fluorine resin, silicon, carbon and silicon carbide.

In the etching method according to the present invention, etching gas and oxygen are introduced continuously in the anti-etching film forming step when silicon is used as the solid material.

ADVANTAGES OF THE INVENTION

In an etching system according to the present invention, a floating electrode is arranged vis-à-vis a substrate electrode in a vacuum chamber and held in a floating state in terms of electric potential and a material is placed for forming an anti-etching film at the side of the floating electrode facing the substrate electrode while a control unit is provided so as to intermittently apply high frequency power to the floating electrode. With this arrangement, it is not necessary to use solenoid valves for switching from a gas to another. Additionally, the number of switching valves can be reduced and it is not necessary to provide a large vacuum pump for the purpose of expelling CF type gas that is necessary in a polymerization step but obstructive in an etching step so that the entire system can be simplified and down-sized to reduce the cost. Still additionally, if compared with a system where CF type gas is introduced in a polymerization step, the extent of generation of particles is by far reduced with an etching system according to the present invention to facilitate the maintenance of the system and make it possible to operate the system in a stable manner.

According to an etching method of the invention, a substrate etching step of etching the substrate by introducing etching gas into the vacuum chamber, an anti-etching film forming step of forming an anti-etching film on the substrate by sputtering a solid material arranged vis-a-vis the substrate and an anti-etching film removing step of applying high frequency bias power to the substrate electrode where the substrate is arranged and etching part of the anti-etching film are repetitively conducted to reduce the number of different processing steps and allow a high etch selectivity to be taken for a mask. Then, it is possible to realize highly anisotropic and deep etching. Additionally, if compared with a system where CF type gas is introduced in a polymerization step, the extent of generation of particles is by far reduced with an etching system according to the present invention to make it possible to process substrates and realize a high yield.

BRIEF DESCRIPTION OF THE DRAWINGS

Now, the present invention will be described in greater detail by referring to the accompanying drawings that illustrate a preferred embodiment of the invention.

BEST MODE FOR CARRYING OUT THE INVENTION

Figure 1:
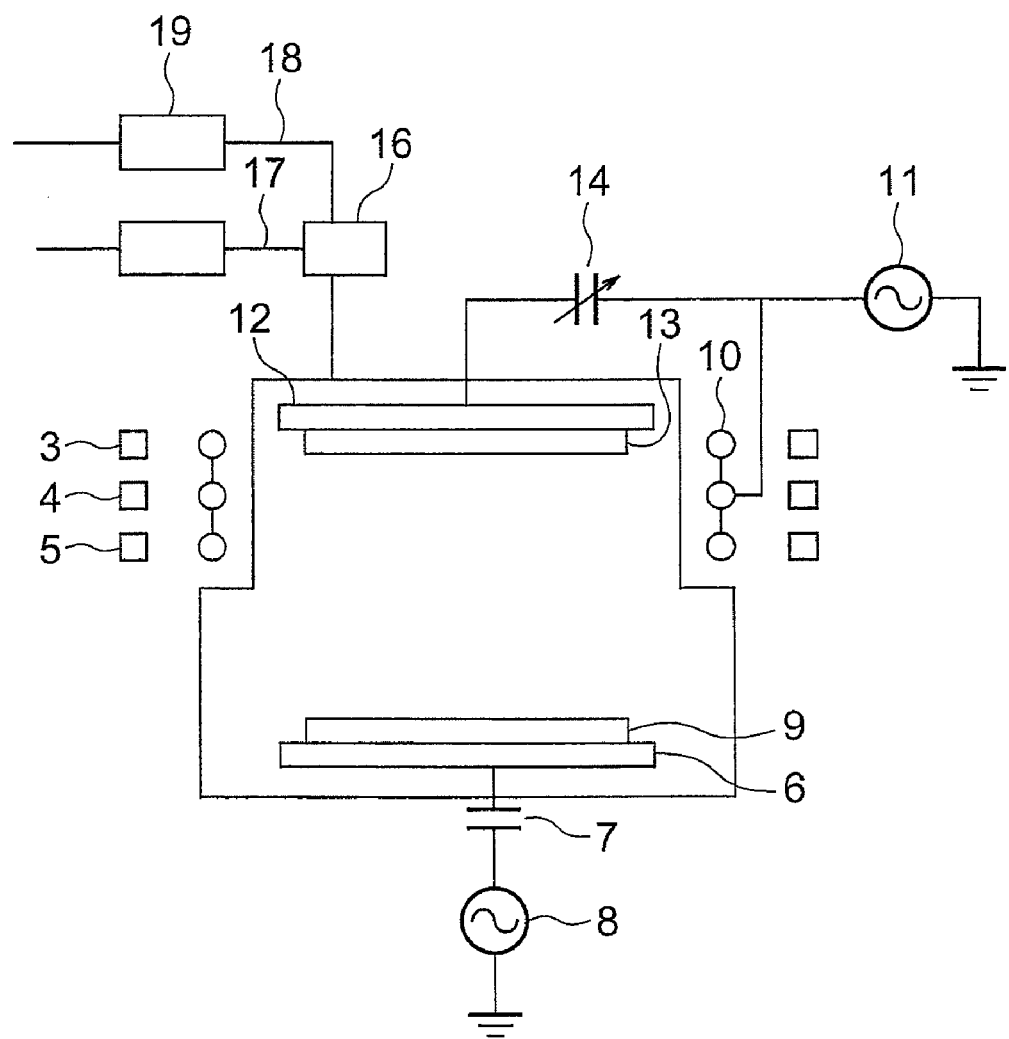
FIG. 1 is a schematic circuit diagram showing an embodiment of etching system according to the present invention.

FIG. 1 illustrates a schematic circuit diagram of an embodiment of silicon etching system, which is an NLD (magnetic neutral line discharge) system. Referring to FIG. 1 that illustrates the embodiment of etching system, 1 denotes a vacuum chamber having a plasma generating section 1*a* at an upper part thereof and a substrate processing section 1*b*. An exhaust port 1*c* is arranged at the substrate processing section 1*b* and connected to an appropriate exhaust system.

The plasma generating section 1*a* is provided with a cylindrical dielectric side wall 2 and three magnetic field coils 3, 4, 5 are arranged outside the dielectric side wall 2 to operate as magnetic field generating means for producing a magnetic neutral line in the inside of the vacuum chamber 1. These coils produce a magnetic neutral line in the inside of the plasma generating section 1a arranged at an upper part of the vacuum chamber 1. A substrate electrode 6 is arranged at a lower part of the vacuum chamber 1 by way of an insulating member interposed between them. The substrate electrode 6 is connected to a high frequency power source 8 to be used for applying an RF bias by way of a blocking condenser 7, and a silicon substrate 9 to be subjected to an etching process is fitted onto the substrate electrode 6.

Three high frequency coils 10 are arranged for the purpose of generation of plasma between the three magnetic filed coils 3, 4, 5 and the outside of the dielectric side wall 2. The high frequency coils 10 are connected to a high frequency power source 11 and adapted to apply an alternating electric field along the magnetic neutral line formed in the inside of the plasma generating section 1a arranged at an upper part of the vacuum chamber 1 to generate discharge plasma.

While the use of an NDL (magnetic neutral line discharge) system is preferable for the purpose of the present invention because the diameter and the size of plasma can be controlled with it to make it possible to control the etching operation and the sputtering operation better than the use of an ordinary system, the present invention is by no means limited to the use of an NDL system so long as the employed system can generate plasma.

A top plate 12 of the plasma generating section 1a arranged at an upper part of the vacuum chamber 1 is rigidly fitted to a top end section of the dielectric side wall 2 through an insulating member (not shown) in a hermetically sealed manner. The top plate 12 is arranged so as to be held in a floating state in terms of electric potential and operate as floating electrode. The top plate 12 is formed by using a solid material 13 that can be arbitrarily selected from fluorine resin, silicon, carbon, silicon carbide, silicon oxide and silicon nitride so as to operate as target. High frequency power is applied to the floating electrode 12 from a plasma-generating high frequency power source 11 of the high frequency antenna coils 10 by way of a variable condenser 14 that is a control unit for intermittently applying high frequency power to the floating electrode 12, the control unit being arranged on a branch from the power feed path from the plasma generating high frequency power source 11 to the high frequency antenna coils 10 so as to cause the floating electrode 12 to generate an auto-bias or self-bias. The variable condenser 14 may be replaced by a switch. The high frequency power source 11 may be by two high frequency power sources, one for the floating electrode 12 and the other for the high frequency antenna coils 10.

The plasma generating section 1a arranged at an upper part of the vacuum chamber 1 is provided with a gas introducing section 15 for introducing main gain, or rare gas, and etching gas into the vacuum chamber 1, which gas introducing section 15 is connected to a gas mixing section 16. The gas mixing section 16 is by turn connected to a rare bas supply source (not shown) by way of a rare gas supply path 17 and also to an etching gas supply source (not shown) by way of an etching gas supply path 18 and an etching gas supply and flow rate control unit 19 for controlling the supply and the flow rate of etching gas. The rare gas supply source is adapted to supply at least any one of Ar, Xe, Kr or $N_2$ as rare gas. The etching gas supply source is adapted to supply at least any one of $SF_6$, $NF_3$, $F_2$, $SiF_4$ or $XeF_2$ as etching gas.

Figure 2:
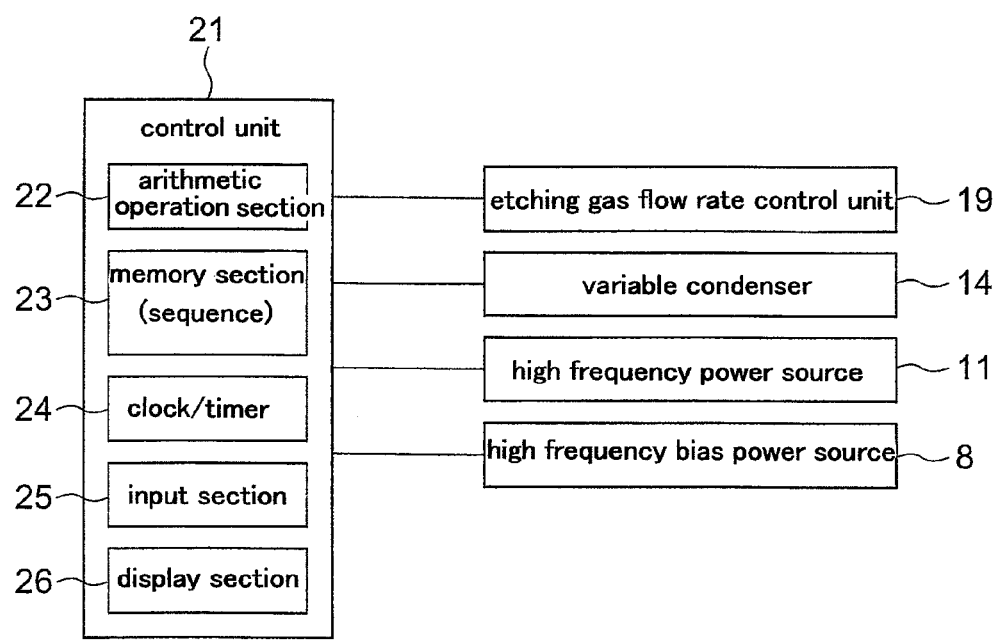
FIG. 2 is a schematic block diagram showing the control unit of the system of FIG. 1.

FIG. 2 is a schematic block diagram of the control unit used for the system of FIG. 1, showing the operating partners to which it is connected. Referring to FIG. 2, 21 denotes the control unit for controlling the operation of each of the components of the system of FIG. 1. The control unit 21 comprises an arithmetic operation section 22, a memory section 23, a clock/timer 24, an input section 25 and a display section 26.

The control unit 21 is connected to an etching gas flow rate control unit 19, a variable condenser 14, a high frequency power source 11 and a high frequency bias power source 8.

The arithmetic operation section 22 is adapted to generate control signals for the components, using the sequence stored in the memory section 23 and the predefined values input to it from the input section 25 and output them by referring to the clock/timer 24.

The operator can define the sputtering time of the solid material 13, the etching time of the substrate 9, the bias application time of the substrate electrode 6, the rate at which power is applied to the floating electrode 12 for sputtering, the rate at which bias power is applied to the substrate electrode and the rate at which etching gas is introduced by means of the input section 25. The display section 26 displays input values and controlled states.

The operation of the illustrated etching system having the above-described configuration will now be described below by referring to the sputter modulation sequence illustrated in FIG. 3 as example.

Figure 3:
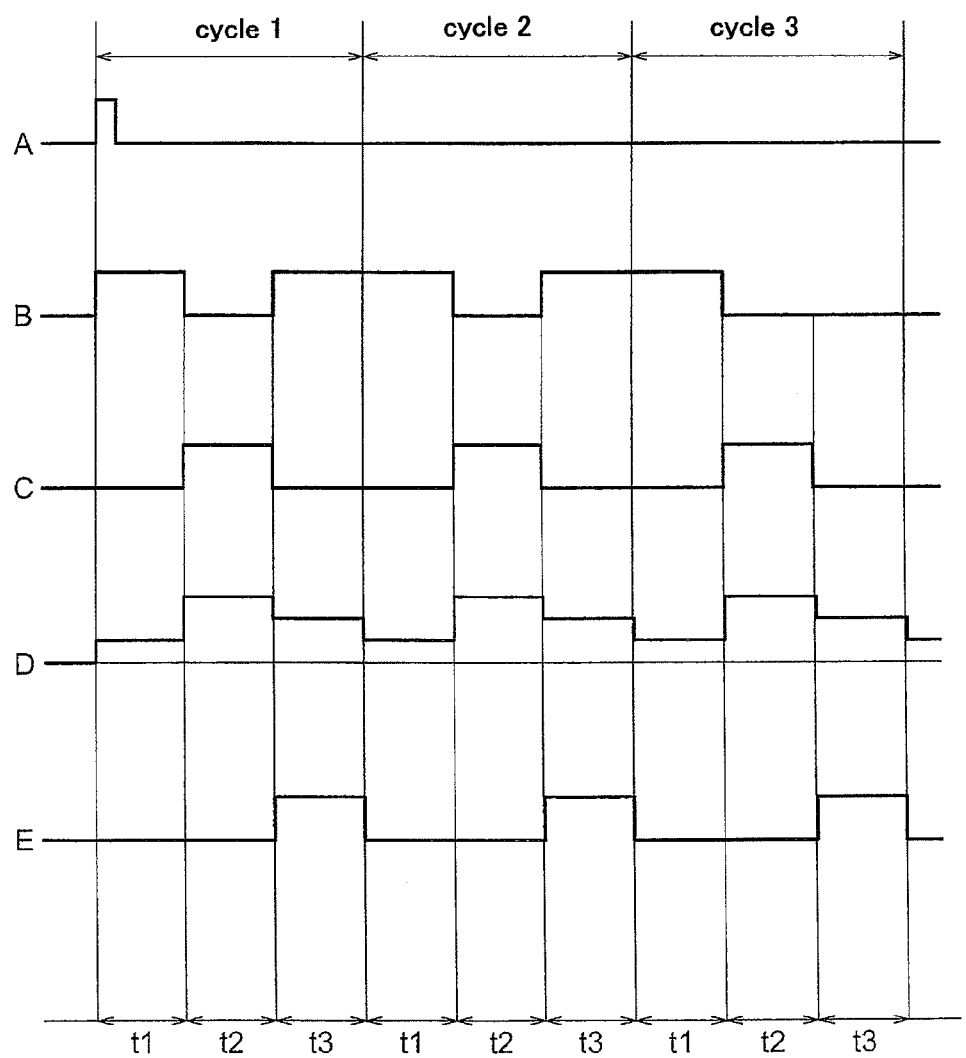
FIG. 3 is a chart illustrating a sputter modulation sequence defined, as an example, for the control unit of FIG. 2 so as to be used for the operation of the embodiment of etching system of FIG. 1.

FIG. 3 shows the timings of three cycles, each cycle involving a substrate etching step, an anti-etching film forming step and an anti-etching film removing step. Referring to FIG. 3, signal A is a trigger signal and signal B is a signal indicating the control timing of the etching gas supply and flow rate control unit 19, whereas signal C is a signal indicating the control timing of the variable condenser 14 and signal D and signal E are signals respectively indicating the control timing of the high frequency power source 11 and that of the high frequency bias power source 8.

Firstly, in cycle 1, the etching gas supply and flow rate control unit 19 is operated for a substrate etching step, which is indicated by t1, to introduce etching gas. The gas mixing section 16 mixes Ar gas from the rare gas supply path 17 with etching gas, which is $SF_6$, and the obtained mixture gas is introduced into the vacuum chamber. The variable condenser 14 and the high frequency bias power source 8 are held OFF so that no high frequency power is supplied to the floating electrode 12 and the substrate electrode 6. Power is supplied from the high frequency power source 11 to the antenna 10 for plasma generation, and thus the substrate 9 is subjected to an etching process.

Then, the operation of the etching gas supply and flow rate control unit 19 is suspended for the succeeding anti-etching film forming step, which is indicated by t2, and the supply of etching gas, or $SF_6$, is also suspended so that only Ar gas is introduced into the vacuum chamber. As the variable condenser 14 is turned ON to raise the output of the high frequency power source 11 so that high frequency power is applied to the top plate, or the floating electrode 12. Under this condition, the target in the inside of the floating electrode 12 is sputtered and fluorine resin film is deposited on the silicon substrate 9 as anti-etching film.

Subsequently, the application of high frequency power to the floating electrode 12 is suspended and high frequency power is applied to the substrate electrode 6 for the succeeding anti-etching film removing step, which is indicated by t3. Under this condition, the surface deposit of fluorine resin film that runs in parallel with the surface of the silicon substrate 9 is removed, although the fluorine resin film on the lateral walls of the pattern that is produced with the deposit on the silicon substrate 9 is not removed and left there. At this time, the etching gas supply and flow rate control unit 19 may be turned ON to introduce etching gas or it may not be turned ON.

In cycle 2, the operation returns to the substrate etching step and the etching gas supply and flow rate control unit 19 is operated. The gas mixing section 16 mixes Ar gas from the rare gas supply path 17 with etching gas, which is $SF_6$, and the obtained mixture gas is introduced into the vacuum chamber. The supply of RF power to the floating electrode 12 and the substrate electrode 6 are held OFF for an etching process.

Thereafter, the anti-etching film forming step, the anti-etching film removing step and the substrate etching step are repeated to continue the etching process until a desired etching depth is achieved.

Alternatively, it is possible to arrange the operation in such a way that, after depositing fluorine resin film on the silicon substrate 9, high frequency bias is applied to the substrate electrode 6 in order to remove the fluorine resin film deposited on a plane running in parallel with the surface of the silicon substrate 9, leaving the fluorine resin film on the lateral walls of the pattern that is produced as deposit, and at the same time etching gas is mixed with main gas and introduced into the vacuum chamber 1 so that the operation may move to the etching step.

Still alternatively, it is also possible to flow mixture gas of main gas and etching gas throughout all the processing steps.

EXAMPLE

Now, the present invention will be described further by way of an example that is based on the sputter modification sequence illustrated in FIG. 3, referring to FIG. 4. A mask 30 of $SiO_2$ was formed on the surface of a substrate 9 and partly removed to make itself agree with the pattern, according to which the substrate 9 was to be etched.

Figure 4:
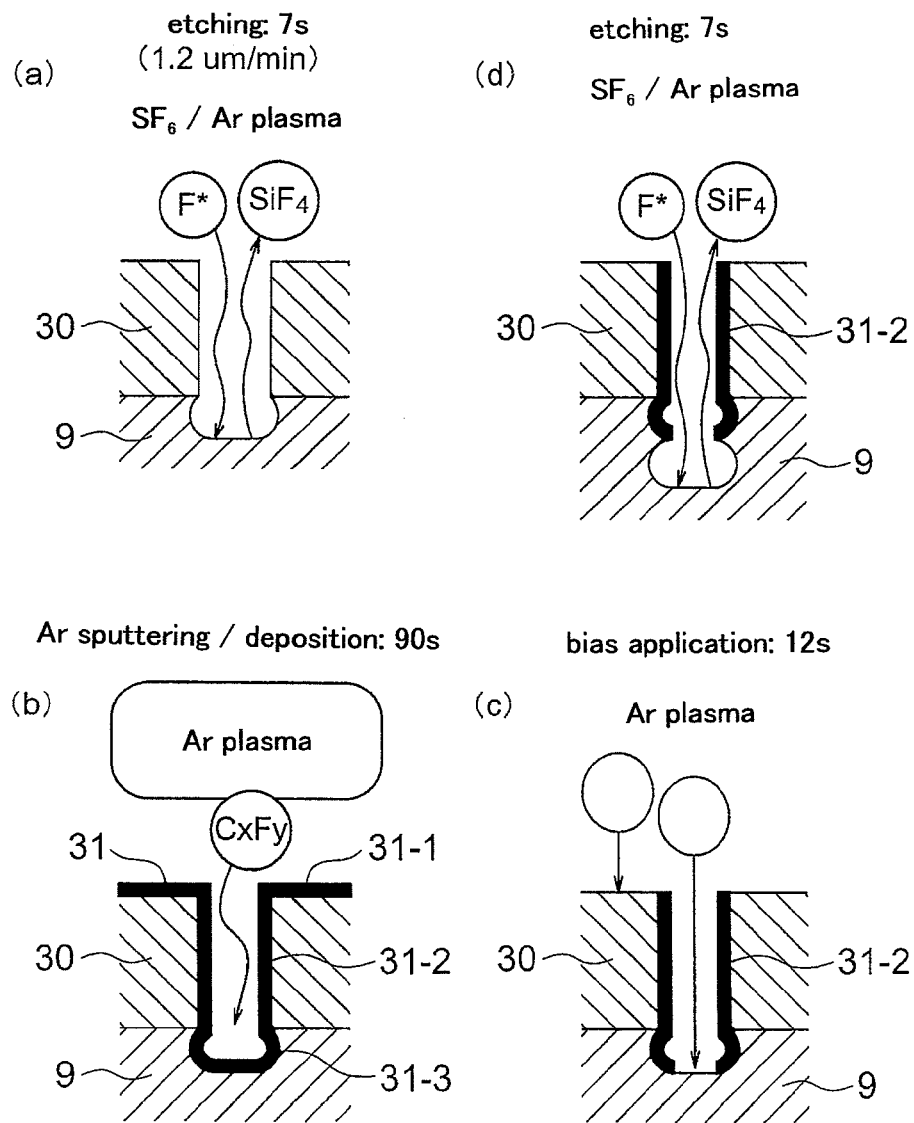
FIGS. 4(*a*) through 4(*d*) are schematic illustrations of the operation of the system of FIG. 1.

Firstly, the etching gas supply and flow rate control unit 19 was operated in the substrate etching step illustrated in (a) of FIG. 4 and the gas mixing section 16 mixed Ar gas coming from the rare gas supply path 17 at a rate of 50 sccm and etching gas, or $SF_6$, coming at a rate of 50 sccm. The mixture gas was introduced into the vacuum chamber 1 and the supply of high frequency power to the floating electrode 12 and the substrate electrode 6 was turned off. Under this condition, the etching process was conducted for 7 seconds. As a result, the substrate 9 was etched by a predetermined depth in areas where the mask 30 had been removed.

Then, in the anti-etching film forming step illustrated in (b) of FIG. 4, the operation of the etching gas supply and flow rate control unit 19 was suspended and hence the supply of etching gas, of $SF_6$, was suspended and only Ar gas was introduced into the vacuum chamber at a rate of 50 sccm, while high frequency power was applied to the top plate, or the floating electrode 12. Under this condition, the target in the inside of the floating electrode 12 was sputtered to deposit fluorine resin for 90 seconds on the entire surface of the silicon substrate 9 and the mask 30 for an anti-etching film 31. The anti-etching film 31 included films 31-1, 31-3 deposited on a plane running in parallel with the surface of the silicon substrate 9 and a film 31-2 deposited on each of the vertical pattern lateral walls.

Thereafter, in the anti-etching film removing step illustrated in (c) of FIG. 4, the application of high frequency power to the floating electrode 12 was suspended and high frequency power of 200 W was applied to the substrate electrode 6 for 12 seconds. Under this condition, the fluorine resin films 31-1, 31-3 deposited on a plane running in parallel with the surface of the silicon substrate 9 were removed, although the fluorine resin film 31-2 on the lateral walls of the pattern that had been produced with the deposit on the silicon substrate 9 was not removed and left there.

Subsequently, in the substrate etching step illustrated in (d) of FIG. 4, Ar gas coming from the rare gas supply path 17 at a rate of 50 sccm and etching as, or $SF_6$, coming at a rate of 50 sccm were mixed again. The mixture gas was introduced into the vacuum chamber 1 and the supply of high frequency power to the floating electrode 12 and the substrate electrode 6 was turned off. Under this condition, the etching process was conducted for 7 seconds. As a result, the bottoms of the holes formed by the preceding substrate etching step were etched, although the anti-etching film 31-2 on the vertical plane of each of the holes was not removed and left there. Thus, it was possible to realize anisotropic etching in the vertical direction.

Figure 5:
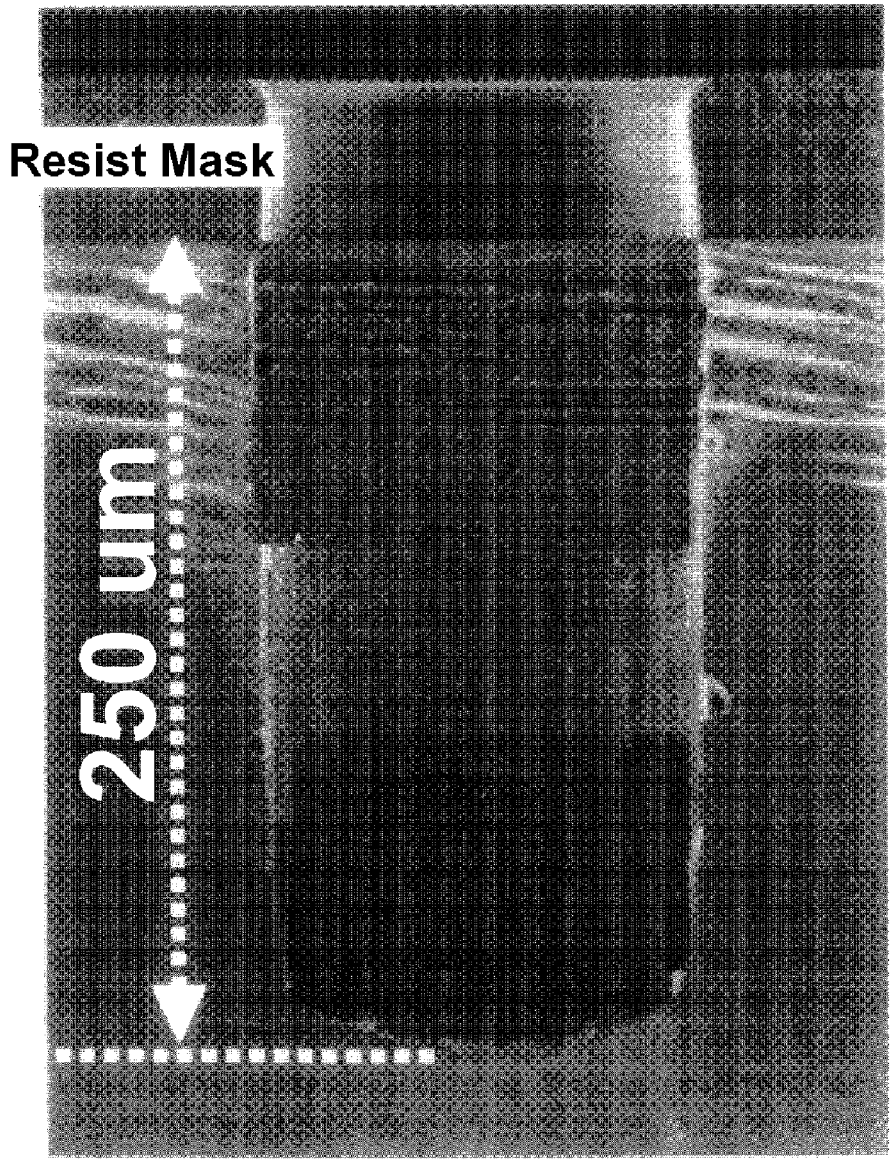
FIG. 5 is a schematic cross sectional view showing an etched product obtained by means of the system of FIG. 1.

Then, the processing steps of (b)~(d) of FIG. 4 were repeated for thirty times. FIG. 5 is a schematic cross sectional view of the etched product.

Figure 6:
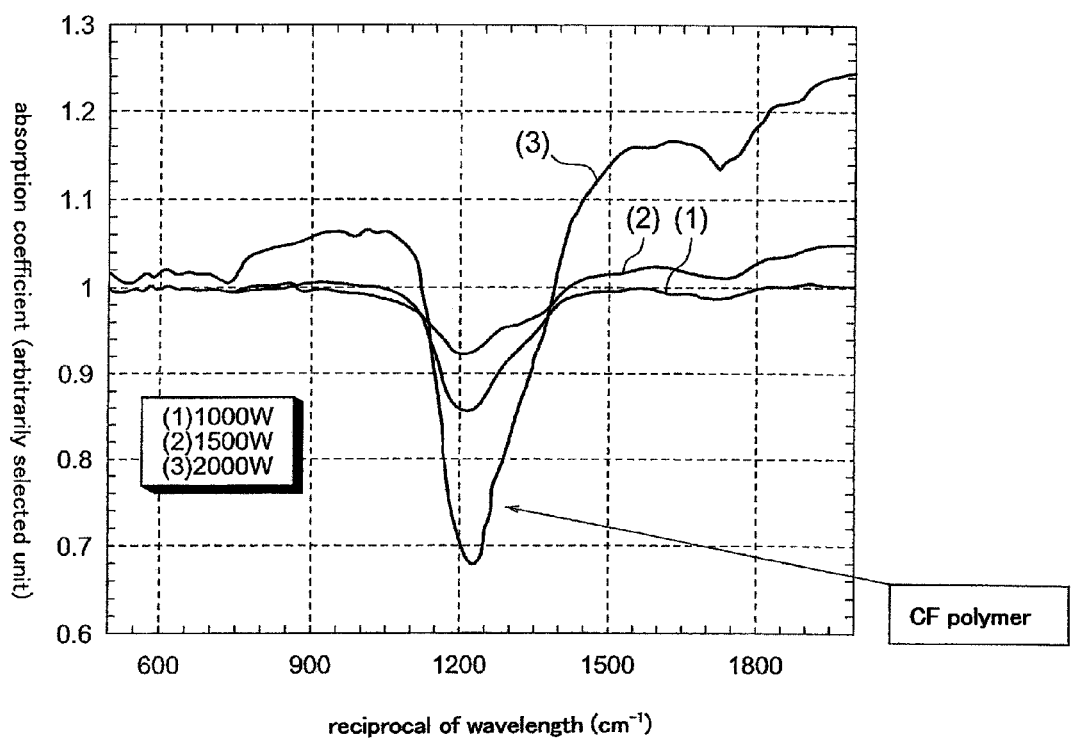
FIG. 6 is a graph illustrating the relationship between the polymer film forming rate and the high frequency power applied to the high frequency antenna coil of the system of FIG. 1.

Preferable processing conditions for the present invention will be listed below.

etching step:
  Pa/Pb=2,000/0W
  $Ar/SF_6$=50/500 sccm
  pressure in vacuum chamber=50 mTorr polymer deposition step;
  Pa/Pb=1,000/0W
  Ar=50 sccm
  pressure in vacuum chamber=20 mTorr
  top plate=200 pF polymer removal step:
  Pa/Pb=2,000/25 W
  $Ar/SF_6$=50/500 sccm
  pressure in vacuum chamber=50 mTorr FIG. 6 is a graph illustrating the relationship between the polymer film forming rate and the high frequency power applied to the high frequency antenna coil 10 of the system of FIG. 1. In the graph of FIG. 6, the abscissa represents the reciprocal ($cm^{-1}$) of the wavelength and the ordinate represents the absorption coefficient (with an arbitrarily selected unit).

Figure 7:
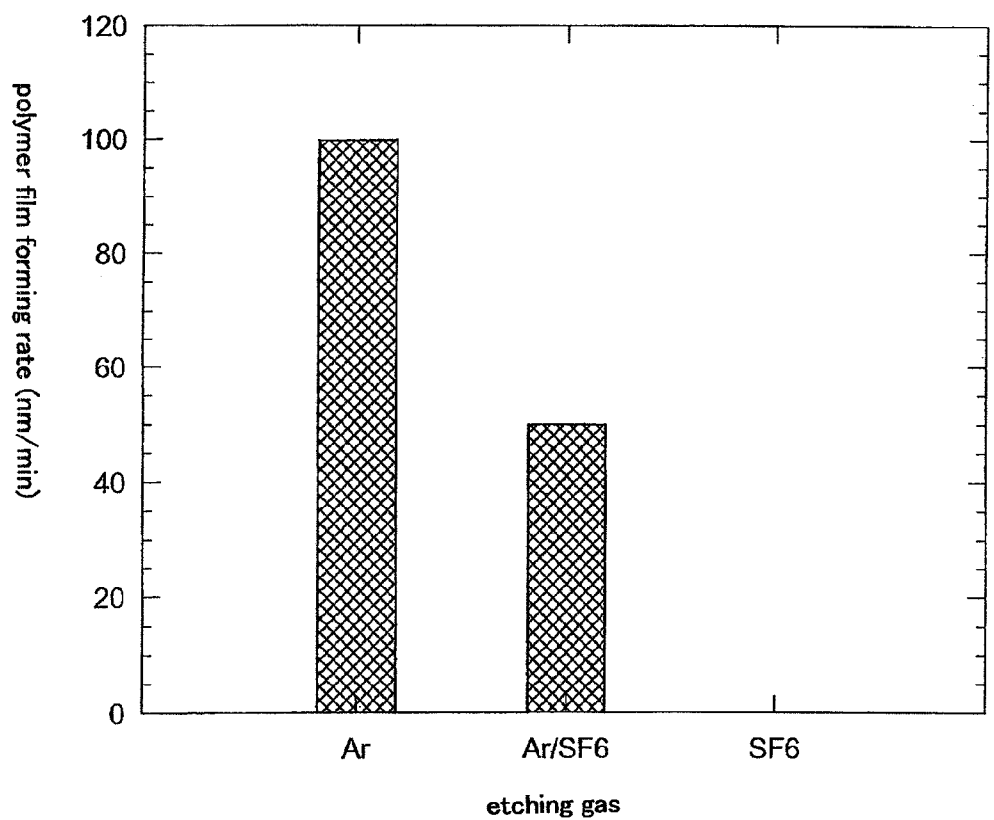
FIG. 7 is a graph illustrating the relationship between the polymer film forming rate and the gases that can be used for the system of FIG. 1.

FIG. 7 is a graph illustrating the relationship between the polymer film forming rate and the gases that can be used for the system of FIG. 1. In the graph of FIG. 7, the abscissa represents the gases and the ordinate represents the polymer film forming rate. As seen from FIG. 7, the polymer film forming rate drops to half when a mixture gas of Ar and $SF_6$ is introduced from the level that is achieved when only Ar gas is introduced and substantially falls to nil when the supply of Ar is suspended to introduce only $SF_6$ gas. Therefore, a high film forming rate can be achieved when depositing fluorine resin film on a substrate by suspending the supply of etching gas.

While fluorine resin, silicon, carbon, silicon carbide, silicon oxide or silicon nitride is used as inner wall material for the top plate 12 in the illustrated embodiment, a compound or a composite of any of the above listed substances may alternatively be used for the purpose of the present invention.

When silicon is used for the solid material, there are occasions where etching gas and oxygen gas are introduced continuously in the anti-etching film forming step where the solid material is sputtered. As the solid material of silicon is sputtered, silicon and etching gas/oxygen gas react with each other in a gas layer to produce silicon compounds (sulfide, oxide, sulfide/oxide, etc.). An anti-etching film is formed by depositing such silicon compounds on the substrate 9.

While the illustrated embodiment is an NLD etching system, it will be appreciated that the present invention can be embodied as an IPC etching system as well.

An etching system according to the present invention does not use passivation gas and hence the consumption rate and the exhaust rate of gas that shows a high atmosphere warming coefficient such as fluorocarbon gas are low. Thus, the present invention can lessen the environmental load and suppress the cost of processing exhaust gas. Additionally, $SF_6$ can be replaced by $F_2$.

Furthermore, according to the present invention, it is possible to etch not only silicon substrates but also quartz ($SiO_2$, silicon borate glass, Pyrex, soda glass). More specifically, quartz ($SiO_2$, silicon borate glass, Pyrex, soda glass) can be etched by means of a predetermined solid material (CxFx) by applying high frequency power to the substrate electrode, while sputtering CxFx also by applying high frequency power to the floating electrode.

Industrial Applicability

Since an etching method and an etching system according to the present invention are adapted to produce a high etch selectivity for a mask, an excellent anisotropic profile and a large etching depth, they can advantageously be find applications in the field of forming micro electromechanical systems and manufacturing micro electronic apparatus.

What is claimed is:

1. An etching method for etching a substrate arranged in a vacuum chamber by generating plasma, comprising:
   a substrate setting step of setting up the substrate with a mask removed partly in the vacuum chamber;
   a substrate etching step of etching the substrate by introducing etching gas into the vacuum chamber;
   an anti-etching film forming step of forming an anti-etching film on the substrate by sputtering a solid material arranged vis-à-vis the substrate; and
   an anti-etching film removing step of applying high frequency bias power to the substrate electrode where the substrate is arranged and etching part of the anti-etching film;
   wherein the substrate etching step, the anti-etching film forming step and the anti-etching film removing step are continuously and repeatedly performed two or more times for one substrate.

2. The etching method according to claim 1, wherein rare gas is used as sputtering gas in the anti-etching film forming step.

3. The etching method according to claim 1, wherein a mixture of rare gas and etching gas is used in the substrate etching step.

4. The etching method according to claim 1, wherein rare gas or a mixture of rare gas and etching gas is used in the anti-etching film removing step.

5. The etching method according to claim 1, wherein a predetermined rare gas is introduced into the vacuum chamber in each of the substrate etching step, the anti-etching film forming step and the anti-etching film removing step and that etching gas is added to rare gas to form a mixture gas to be used in the substrate etching step or the substrate etching step and the anti-etching film removing step.

6. The etching method according to claim 2, wherein rare gas is selected from Ar, Xe, Kr and $N_2$.

7. The etching method according to claim 1, wherein etching gas is selected from $SF_6$, $NF_3$, $F_2$, $SiF_4$ and $XeF_2$.

8. The etching method according to claim 1, wherein the substrate etching step is conducted without applying high frequency bias power to the substrate electrode.

9. The etching method according to claim 1, wherein the solid material is selected from fluorine resin, silicon, carbon and silicon carbide.

10. The etching method according to claim 1, wherein the solid material is silicon etching gas and oxygen are introduced continuously in the anti-etching film forming step.

11. The etching method according to claim 1, wherein the substrate is silicon.

* * * * *